United States Patent
Pyo et al.

(10) Patent No.: US 10,600,466 B2
(45) Date of Patent: *Mar. 24, 2020

(54) RESISTIVE MEMORY DEVICE HAVING REDUCED CHIP SIZE AND OPERATION METHOD THEREOF

(71) Applicant: SAMSUNG ELECTRONICS CO., LTD., Suwon-si, Gyeonggi-Do (KR)

(72) Inventors: Suk-Soo Pyo, Hwaseong-si (KR); Hyun-Taek Jung, Seoul (KR); Tae-Joong Song, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/450,035

(22) Filed: Jun. 24, 2019

(65) Prior Publication Data

US 2019/0311755 A1    Oct. 10, 2019

Related U.S. Application Data

(63) Continuation of application No. 15/919,876, filed on Mar. 13, 2018, now Pat. No. 10,373,664.

(51) Int. Cl.
*G11C 11/00* (2006.01)
*G11C 11/16* (2006.01)
(Continued)

(52) U.S. Cl.
CPC ............ *G11C 11/1697* (2013.01); *G11C 8/08* (2013.01); *G11C 11/1657* (2013.01);
(Continued)

(58) Field of Classification Search
CPC ............ G11C 11/1697; G11C 11/1657; G11C 11/1659; G11C 11/1675; G11C 11/1693
See application file for complete search history.

(56) References Cited

U.S. PATENT DOCUMENTS

| | | | |
|---|---|---|---|
| 8,649,204 B2 * | 2/2014 | Park | G11C 13/00 365/148 |
| 9,570,171 B2 | 2/2017 | Haukness | |

(Continued)

OTHER PUBLICATIONS

U.S. Appl. No. 15/919,876, filed Jun. 2019, Pyo et al.*
U.S. Office Action dated Dec. 13, 2018 in Corresponding U.S. Appl. No. 15/919,876.

*Primary Examiner* — Pho M Luu
(74) *Attorney, Agent, or Firm* — F. Chau & Associates, LLC

(57) ABSTRACT

A resistive memory device includes: a voltage generator generating a write word line voltage according to activation of a write enable signal; a switch circuit outputting one of the write word line voltage and a read word line voltage in response to the write enable signal as an output voltage; a word line power path connected to the switch circuit to receive the output voltage; and a word line driver driving a word line according to a voltage applied to the word line power path, wherein a write command starts to be received after a certain delay following the activation of the write enable signal, and a write operation is performed within an activation period of the write enable signal in response to the received write command.

12 Claims, 15 Drawing Sheets

(51) Int. Cl.
  *G11C 8/08* (2006.01)
  *G11C 13/00* (2006.01)
  *G11C 11/56* (2006.01)

(52) U.S. Cl.
  CPC ...... *G11C 11/1659* (2013.01); *G11C 11/1673* (2013.01); *G11C 11/1675* (2013.01); *G11C 11/1693* (2013.01); *G11C 13/003* (2013.01); *G11C 13/0028* (2013.01); *G11C 13/0061* (2013.01); *G11C 13/0069* (2013.01); *G11C 11/5607* (2013.01); *G11C 13/004* (2013.01); *G11C 13/0004* (2013.01); *G11C 13/0007* (2013.01); *G11C 2013/0071* (2013.01); *G11C 2213/79* (2013.01)

(56) References Cited

U.S. PATENT DOCUMENTS

| | | | |
|---|---|---|---|
| 9,583,170 B2* | 2/2017 | Kim | G11C 11/1675 |
| 9,711,203 B2* | 7/2017 | Antonyan | G11C 11/1697 |
| 2019/0074045 A1 | 3/2019 | Pyo et al. | |

* cited by examiner

RESISTIVE MEMORY DEVICE HAVING REDUCED CHIP SIZE AND OPERATION METHOD THEREOF

CROSS-REFERENCE TO RELATED APPLICATIONS

This application is a continuation application of U.S. patent application Ser. No. 15/919,876 filed Mar. 13, 2018, which claims the benefit of Korean Patent Application No. 10-2017-0113949, filed on Sep. 6, 2017, in the Korean Intellectual Property Office, the disclosures of which are incorporated by reference in their entirety herein.

BACKGROUND

1. Technical Field

The inventive concept relates to a resistive memory device, and more particularly, to a resistive memory device having a reduced chip size, and an operation method thereof.

2. Discussion of Related Art

Due to the demand for producing higher-capacity and lower-power memory devices, next-generation memory devices having non-volatility are being studied. Resistive memory devices, as an example of such next-generation memory devices, may have properties such as high integration of dynamic random-access memory (DRAM), non-volatility of flash memory, and high speed of static RAM (SRAM). Resistive memory devices include phase change RAM (PRAM), magnetic RAM (MRAM), and resistive RAM (RRAM). Data in MRAM is not stored as electric charge or current flows, but by magnetic storage elements. A PRAM uses the fact that chalcogenide glass changes between two states, polycrystalline and amorphous by the passage of current which produces heat as it passes through a cell. An RRAM works by changing the resistance across a dielectric solid-state material often referred to as a memristor.

In write and read operations of a resistive memory device, a current/voltage may be provided to a memory cell. For example, in a write operation and a read operation of a resistive memory device, a word line needs to be driven by word line voltages at different levels. However, power separation between the write operation and the read operation may require that chip size be increased to an undesirable size.

SUMMARY

At least one embodiment of the inventive concept provides a memory device having a reduced chip size through management of word line power, and an operation method thereof.

According to an exemplary embodiment of the inventive concept, there is provided a resistive memory device including: a voltage generator generating a write word line voltage according to activation of a write enable signal; a switch circuit outputting one of the write word line voltage and a read word line voltage in response to the write enable signal as an output voltage; a word line power path connected to the switch circuit to receive the output voltage; and a word line driver driving a word line according to a voltage applied to the word line power path, wherein a write command starts to be received after a certain delay following the activation of the write enable signal, and a write operation is performed within an activation period of the write enable signal in response to the received write command.

According to an exemplary embodiment of the inventive concept, there is provided a resistive memory device including: a voltage generator generating a write word line voltage according to activation of a write enable signal; a word line power path connected to a first node receiving the write word line voltage and a second node receiving a read word line voltage in a switchable manner; a word line driver driving a word line according to a voltage applied to the word line power path; and control logic receiving a write command and a read command together during an activation period of the write enable signal and performing a write operation corresponding to the write command and a read operation corresponding to the read command within the activation period.

According to an exemplary embodiment of the inventive concept, there is provided a method of operating a resistive memory device, the method including: generating, by a word line driver, a first word line voltage in response to activation of a write enable signal; transferring, by the word line driver, the first word line voltage to a word line power path in response to the activation of the write enable signal; performing, by the word line driver, a write operation by driving a word line by using the first word line voltage, in correspondence with a write command received after a certain delay following the activation of the write enable signal; and performing, by the word line driver, a read operation by driving the word line by using the first word line voltage, in correspondence with at least one read command received during an activation period of the write enable signal.

According to an exemplary embodiment of the inventive concept, a method of operating a memory controller controlling a memory device is provided. The method includes: activating, by the memory controller, a write enable signal and providing the write enable signal to the memory device; starting, by the memory controller, transmission of one or more write commands to the memory device, after a certain delay following the activation of the write enable signal; transmitting, by the memory controller, at least one read command during an activation period of the write enable signal; and deactivating, by the memory controller, the write enable signal after completion of the transmission of the one or more write commands and the at least one read command.

According to an exemplary embodiment of the inventive concept, a memory device is provided. The memory device includes: a resistive memory, a voltage generator configured to provide a write word line voltage and a read word line voltage lower than the write word line voltage, a memory controller, and a word line driver. The memory controller is configured to output a write enable signal in an inactivated state and a first read command during a first period, output the write enable signal in an activated state and a second read command during a second period, and maintain the write enable state in the activated state and output a write command during a third period. The word line driver is configured to apply the read word line voltage to a word line of the resistive memory during the first period to perform the first read command, apply the write word line voltage to the word line during the second period to perform the second read command, and apply the write word line voltage to the word line during the third period to perform the write command.

According to at least one embodiment of the resistive memory device and the operation method thereof of the inventive concept, a chip size may be reduced by integrally managing the word line power path transferring the write word line voltage and the read word line voltage, and since the read operation may be performed regardless of the activation of the write enable signal, efficiency of a memory operation may be improved.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EXEMPLARY EMBODIMENTS

Hereinafter, exemplary embodiments of the inventive concept will be described in detail with reference to the accompanying drawings.

Figure 1:
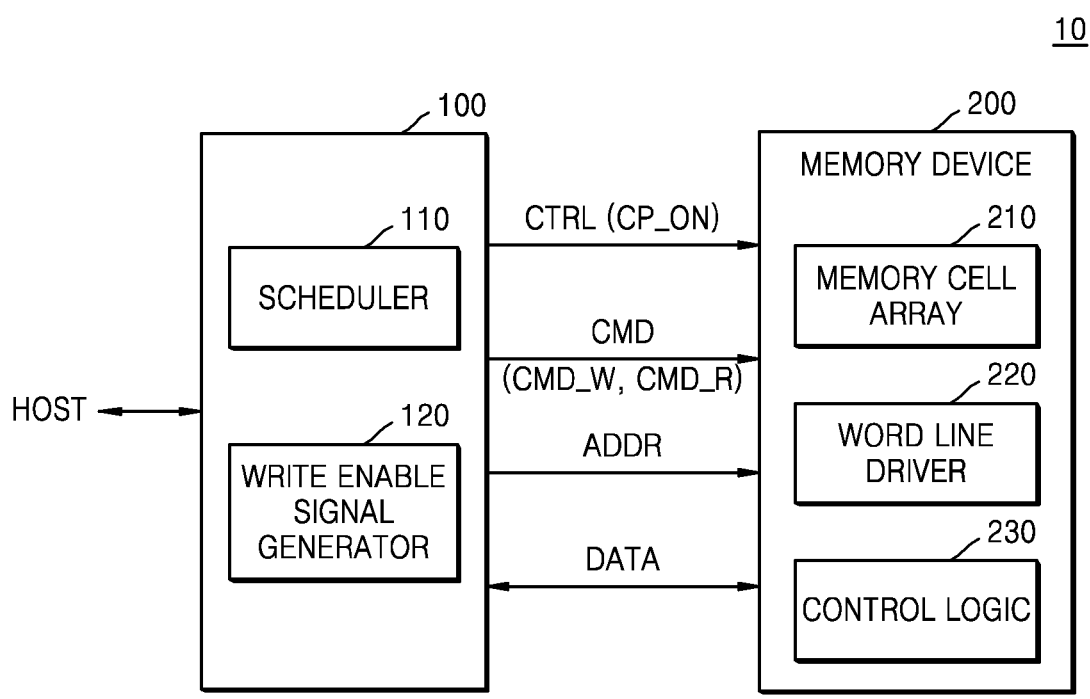
FIG. 1 is a block diagram illustrating a memory system including a memory device, according to an exemplary embodiment of the inventive concept.

FIG. 1 is a block diagram illustrating a memory system including a memory device, according to an exemplary embodiment of the inventive concept. The memory device may include various kinds of memory cells as the inventive concept is not limited to a specific type of memory cell. In the following description, the memory device is assumed to be a resistive memory device including resistive memory cells.

Referring to FIG. 1, a memory system 10 includes a memory controller 100 and a memory device 200. The memory controller 100 includes a scheduler 110 (e.g., a circuit, microprocessor, microcontroller, etc.) and a write enable signal generator 120 (e.g., a signal generation circuit). In addition, the memory device 200 includes a memory cell array 210, a word line driver 220, and control logic 230 (e.g., a control circuit). In the case that the memory cell array 210 includes resistive memory cells, the memory system 10 may be referred to as a resistive memory system.

The memory controller 100 may control the memory device 200 such that data stored in the memory device 200 is read or data is written to the memory device in response to write/read requests from a host HOST (e.g., a host device). Specifically, the memory controller 100 may control data write and read operations with respect to the memory device 200 by providing an address ADDR, a command CMD, and a control signal CTRL to the memory device 200. In addition, data DATA to be written and read data DATA may be transmitted and received between the memory controller 100 and the memory device 200. For example, the command CMD may include read and write commands, and the address ADDR may be the location within the memory cell array 210 to read data from or write data to.

The memory cell array 210 may include memory cells (not shown) arranged in regions in which a plurality of word lines intersect a plurality of bit lines. In addition, each of a plurality of memory cells may be a single level cell (SLC) storing one bit, or a multi-level cell (MLC) capable of storing at least 2 bits of data. Alternatively, the memory cell array 210 may include a single level cell and a multi-level cell that are combined together. When the memory cell array 210 includes a resistive memory cell, the memory cells may have a distribution of a plurality of resistance levels depending upon the number of bits written to one memory cell.

The memory cell array 210 may include various kinds of resistive memory cells. For example, when a variable resistance element includes a phase change material (Ge—Sb—Te, GST) and has a resistance varying with temperatures, the resistive memory device may be a PRAM. As another example, when a variable resistance element includes a top electrode, a bottom electrode, and a complex metal oxide therebetween, the resistive memory device may be a ReRAM. In another example, when a variable resistance element includes a top magnetic electrode, a bottom magnetic electrode, and a dielectric therebetween, the resistive memory device may be an MRAM.

The scheduler 110 manages write and read operations depending upon requests from the host HOST. A write command CMD_W and a read command CMD_R may be provided to the memory device 200 based on the control of the scheduler 110. Thus, the memory controller 100 may determine timings of providing the write command CMD_W and the read command CMD_R to the memory device 200. In addition, when a plurality of write commands CMD_W or read commands CMD_R are provided, the memory controller 100 may determine a period of providing the write commands CMD_W or a period of providing the read commands CMD_R.

The write enable signal generator 120 may generate a write enable signal CP_ON and provide the write enable signal CP_ON to the memory device 200. According to an embodiment, the write enable signal CP_ON is included in the control signal CTRL set forth above. According to an embodiment, the write enable signal CP_ON is activated before the write command CMD_W is actually provided to the memory device 200. That is, after a certain delay following the activation of the write enable signal CP_ON, the write command CMD_W is provided to the memory device 200.

The write enable signal CP_ON may have a certain activation period. As an example, the memory controller 100 may consecutively provide a plurality of write commands CMD_W to the memory device 200. For example, the memory controller 100 could consecutively provide at least two write commands CMD_W to the memory device 200 without any other intervening commands. Alternatively, the memory controller 100 may non-consecutively provide the plurality of write commands CMD_W to the memory device 200. For example, the memory controller 100 could provide an intervening read command CMD_R between two write commands CMD_W. In addition, the write enable signal CP_ON may be activated before a first write command CMD_W is provided, and may be maintained in an activation state at least until a last write command CMD_W is provided. That is, the write enable signal CP_ON may be maintained in the activation state at least while write operations corresponding to the plurality of write commands CMD_W are performed.

According to an embodiment, the memory controller 100 provides one or more read commands CMD_R to the memory device 200 while the write enable signal CP_ON is activated. Thus, the write command CMD_W and the read commands CMD_R may be provided together to the memory device 200 while the write enable signal CP_ON is activated, and the memory device 200 may perform a write operation and a read operation together while the write enable signal CP_ON is activated.

The word line driver 220 provides a word line voltage to word lines of the memory cell array 210 in write and read operations of data. The memory device 200 may include a voltage generator (not shown) generating a write word line voltage and a read word line voltage. As an example, the memory device 200 may separately include a write voltage generator generating the write word line voltage and a read voltage generator generating the read word line voltage. According to an embodiment, the write voltage generator is operated in response to the write enable signal CP_ON. In addition, according to an embodiment, the read voltage generator is operated regardless of the write enable signal CP_ON, or based on the write enable signal CP_ON.

The control logic 230 may control overall operations of the memory device 200. As an example, the control logic 230 may perform the write operation and the read operation by controlling various components in the memory device 200 in response to the write command CMD_W and the read command CMD_R. As an example of an operation, the write voltage generator set forth above may generate a write voltage in response to the write enable signal CP_ON. Alternatively, the control logic 230 may generate an internal control signal related to voltage generation in response to the write enable signal CP_ON, and the write voltage generator may generate the write voltage in response to the internal control signal.

An example of an operation of the memory device 200 according to the configuration set forth above is described below.

The memory device 200 may transfer the write word line voltage and the read word line voltage through a common word line power path (e.g., a wire, a conductive path, etc.) without the need for separation between a power line transferring the write word line voltage and a power line transferring the read word line voltage. As an example, in response to the activation of the write enable signal CP_ON, the write word line voltage is generated by the write voltage generator and applied to the word line power path. On the other hand, when the write enable signal CP_ON is deactivated, the read word line voltage is applied to the word line power path.

In an embodiment, the memory device 200 receives the write command CMD_W from the memory controller 100 after a certain delay following the activation of the write enable signal CP_ON. In an embodiment, the write word line voltage has a higher level than the read word line voltage, and the write voltage generator may include a circuit such as a charge pump to generate the write word line voltage having the higher level. That is, since the memory device 200 receives the write command CMD_W after the certain delay following the activation of the write enable signal CP_ON, the write operation may be performed by driving a word line by using the write word line voltage having a sufficiently increased level.

In addition, while the write enable signal CP_ON is activated, the memory device 200 may further receive one or more read commands CMD_R, and the read operation may be performed by driving the word line by using the write word line voltage applied to the word line power path. That is, while the write enable signal CP_ON is activated, the write operation and the read operation may be performed together, and here, the word line may be driven by using the same write word line voltage in the write and read operations.

In an embodiment, the memory device 200 receives only the read command CMD_R from the memory controller 100 while the write enable signal CP_ON is deactivated. The read word line voltage may be applied to the word line power path in response to the deactivation of the write enable signal CP_ON, and the read operation may be performed by driving the word line by using the read word line voltage.

According to the operations set forth above, while the write enable signal CP_ON is activated, the data write and read operations may be performed by using the write word line voltage. On the other hand, while the write enable signal CP_ON is deactivated, the data read operation may be performed by using the read word line voltage. That is, the write operation may be performed only while the write enable signal CP_ON is activated, and the read operation may be performed regardless of the activation/deactivation of the write enable signal CP_ON. In an embodiment, the voltage driving the word line for the read operation has a level varying depending upon whether the write enable signal CP_ON is activated.

According to the embodiment set forth above, the common word line power path may be used without the need to separate power paths from each other for the write and read operations. In addition, since the common power path is used, a common driver circuit may be used without the need for separation between a write driver and a read driver for driving the word line. Through the configuration set forth above, the chip size for realizing the memory device may be reduced.

The memory controller 100 and the memory device 200 may be integrated into one semiconductor device. For example, the memory controller 100 and the memory device 200 may be integrated into one semiconductor device and thus constitute a memory card. For example, the memory controller 100 and the memory device 200 may be integrated into one semiconductor device and thus constitute a PC card (PCMCIA), a compact flash card (CF), a smart media card (SM/SMC), a memory stick, a multimedia card (MMC, RS-MMC, or MMCmicro), an SD card (SD, miniSD, or microSD), or universal flash storage (UFS).

The memory device 200 may be applied to various other types of memory. As an example, the memory device 200 may be an embedded memory that is built in a semiconductor chip such as an application processor (AP). Alternatively, the memory device 200 may be embedded storage that is built in a data processing system including a host.

Figure 2:
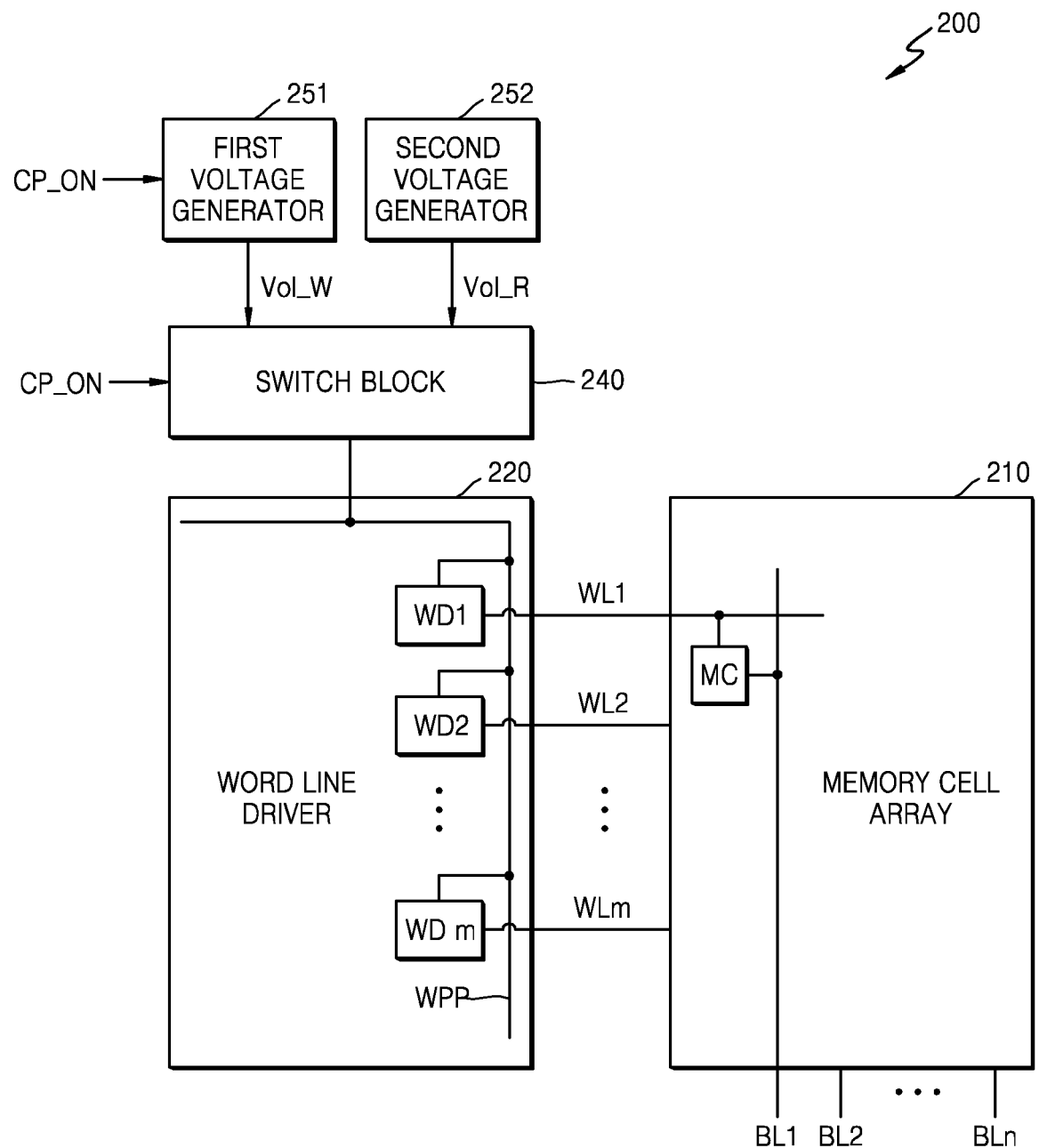
FIG. 2 is a block diagram illustrating an example implementation of the memory device of FIG. 1.

An example of a specific operation of the memory device 200 that may be configured as set forth above is described below. FIG. 2 is a block diagram illustrating an example implementation of the memory device of FIG. 1.

Referring to FIGS. 1 and 2, the memory device 200 includes the memory cell array 210, the word line driver 220, the switch block 240 (e.g., a switching circuit), and first and second voltage generators 251 and 252. Although not shown in FIG. 2, the memory device 200 may further include other components related to the control logic 230 of FIG. 1 and the memory operation. The memory cell array 210 includes memory cells MC arranged in regions in which a plurality of word lines WL1 to WLm intersect a plurality of bit lines BL1 to BLn. In addition, the word line driver 220 includes a plurality of driver circuits WD1 to WDm arranged in correspondence with the word lines WL1 to WLm.

The word line driver 220 includes a word line power path WPP transferring a write word line voltage Vol_W and a read word line voltage Vol_R. In addition, the first voltage generator 251 generates the write word line voltage Vol_W, and the second voltage generator 252 generate the read word line voltage Vol_R. Further, the switch blocks 240 may include one or more switches (for example, power switches), receive the write word line voltage Vol_W and the read word line voltage Vol_R, and selectively provide the write word line voltage Vol_W or the read word line voltage Vol_R to the word line power path WPP based on a switching operation. Each of the driver circuits WD1 to WDm is electrically connected to the word line power path WPP, and drives a corresponding word line according to a voltage transferred through the word line power path WPP.

According to an embodiment, the first voltage generator 251 generates the write word line voltage Vol_W in response to the activation of the write enable signal CP_ON. In addition, the second voltage generator 252 generates the read word line voltage Vol_R regardless of the write enable signal CP_ON. Although not shown in FIG. 2, if the second voltage generator 252 generates the read word line voltage Vol_R in response to the deactivation of the write enable signal CP_ON, the write enable signal CP_ON is provided to the second voltage generator 252.

The switch block 240 may perform a switching operation in response to the write enable signal CP_ON. As an example, the switch block 240 provides the write word line voltage Vol_W to the word line power path WPP while the write enable signal CP_ON is activated. In an embodiment, the switch block 240 provides the read word line voltage Vol_R to the word line power path WPP while the write enable signal CP_ON is deactivated. In an exemplary embodiment, a single voltage generator is used to generate the write word line voltage Vol_W and the read word line voltage Vol_R.

With reference to a first word line WL1, the write and read operations according to an embodiment of the inventive concept are described below.

In an embodiment, the write command CMD_W is received after a certain delay following the activation of the write enable signal CP_ON, and a first driver circuit WD1 may drive the first word line WL1 by using the write word line voltage Vol_W applied to the word line power path WPP, whereby data is written to a memory cell MC connected to the first word line WL1. In an embodiment, at least one read command CMD_R is received during a period of the activation of the write enable signal CP_ON, and the first driver circuit WD1 drives the first word line WL1 by using the write word line voltage Vol_W, whereby data is read from the memory cell MC connected to the first word line WL1.

On the other hand, the read word line voltage Vol_R may be provided to the word line power path WPP in a period of the deactivation of the write enable signal CP_ON, at least one read command CMD_R may be received during the deactivation period of the write enable signal CP_ON, and the first driver circuit WD1 may drive the first word line WL1 by using the read word line voltage Vol_R, whereby data is read from the memory cell MC connected to the first word line WL1.

Figure 3:
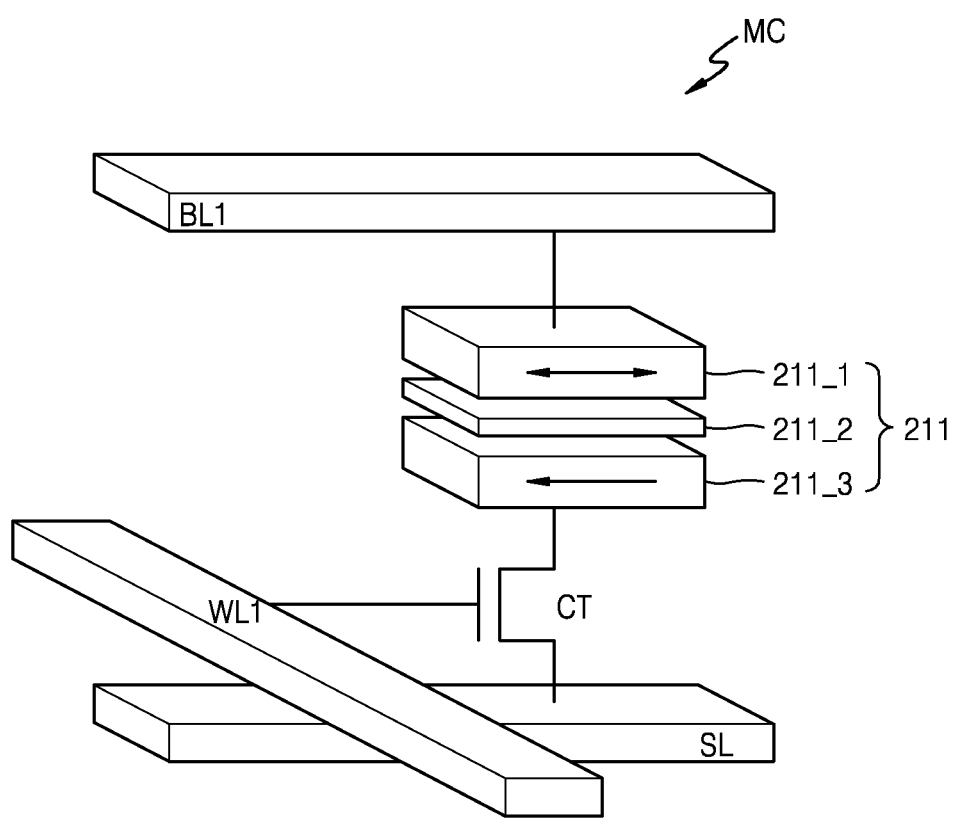
FIG. 3 is a diagram illustrating an example in which a memory cell of FIG. 2 is implemented as a spin transfer torque MRAM (STT-MRAM)

FIG. 3 is a diagram illustrating an example in which the memory cell of FIG. 2 is implemented as spin transfer torque magneto resistive random access memory (STT-MRAM).

Referring to FIGS. 1 to 3, the memory cell MC includes a magnetic tunnel junction (MTJ) element 211 and a cell transistor CT. A gate of the cell transistor CT is connected to the word line (for example, the first word line WL1), and one electrode of the cell transistor CT is connected to the bit line (for example, a first bit line BL1) via the MTJ element 211. In addition, another electrode of the cell transistor CT is connected to a source line SL.

The MJT element 211 includes a free layer 211_1, a tunnel layer 211_2, and a pinned layer 211_3. A magnetization direction of the pinned layer 211_3 may be pinned, and a magnetization direction of the free layer 211_1 may be the same as or opposite to the magnetization direction of the pinned layer 211_3 depending upon conditions. To pin the magnetization direction of the pinned layer 211_3, for example, an anti-ferromagnetic layer (not shown) may be further included in the MTJ element 211.

To write data to the memory cell MC, the cell transistor CT is turned on by providing the write word line voltage Vol_W set forth above to the first word line WL1, and write currents WC1 and WC2 may be applied between the first bit line BL1 and the source line SL. In addition, to read data from the memory cell MC, the cell transistor CT is turned on by providing the write word line voltage Vol_W or the read word line voltage Vol_R as set forth above to the first word line WL1, and a read current is applied from the first bit line BL1 toward the source line SL, whereby data stored in the MTJ element 211 is determined according to a measured resistance value.

When MRAM is applied to embodiments of the inventive concept, the MRAM may correspond to various types. For example, MRAM may be understood as a concept including spin transfer torque RAM (STT-RAM), spin torque transfer magnetization switching RAM (Spin-RAM), spin momentum transfer (SMT-RAM), and other various types of MRAM, in addition to STT-MRAM set forth above.

Figure 4:
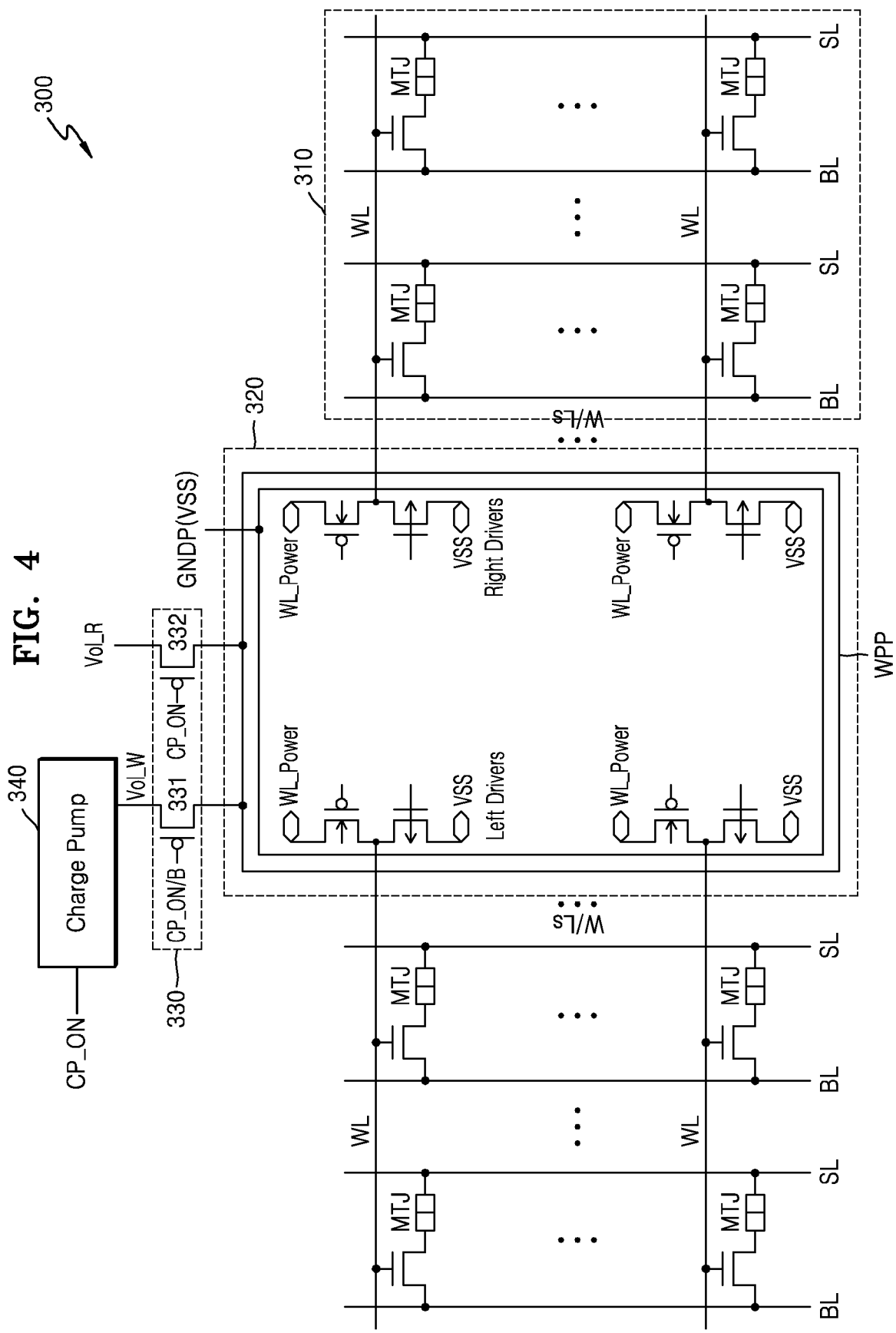
FIG. 4 is a circuit diagram illustrating an example of a specific operation of a memory device, according to an exemplary embodiment of the inventive concept.

FIG. 4 is a circuit diagram illustrating an example of a specific operation of a memory device, according to an exemplary embodiment of the inventive concept. In FIG. 4, the memory device is assumed to be MRAM including an MTJ element, and among components shown in FIG. 4, descriptions of components identical to those described in the above embodiment will be omitted.

Referring to FIG. 4, a memory device 300 includes a memory cell array 310, a word line driver 320 (e.g., a driving circuit), a switch block 330, and a write word line voltage generator 340. Since the memory device 300 corresponds to MRAM, the memory cell array 310 may further include the source line SL in addition to the word line WL and the bit line BL.

As an example, the write word line voltage generator 340 may include a charge pump, and may generate the write word line voltage Vol_W based on a charge pumping operation. In addition, the switch block 330 may include a first switch 331, which provides the write word line voltage Vol_W to the word line power path WPP, and a second switch 332, which provides the read word line voltage Vol_R to the word line power path WPP. Although an example, in which the first and second switches 331 and 332 are implemented as p-type metal oxide semiconductor (PMOS) transistors, is shown in FIG. 4, the first and second switches 331 and 332 may be implemented as other various switches. Although not shown in FIG. 4, the memory device 300 may further include other various components such as control logic and a read word line voltage generator.

As an example of realizing the word line driver 320, FIG. 4 illustrates an example in which the word line driver 320 drives word lines of the memory cell arrays located on the left and the right in the diagram. The word line driver 320 may include driver circuits (or word line driver circuits) in the number corresponding to the number of word lines. As an example, the word line driver 320 may include left driver circuits for driving word lines W/Ls arranged on the left, and right driver circuits for driving word lines W/Ls arranged on the right. In addition, although an example, in which each of the driver circuits is implemented as an inverter, is shown in FIG. 4, the inventive concept is not limited thereto as various other circuits capable of driving the word line may be used. In an embodiment, an inverter of a given word line driver connected to a given word line WL includes a pair of complementary transistors connected to one another at a node. Further, in FIG. 4, the node between the transistors is connected to the given word line WL, and the given word line is connected to gate terminals of cell transistors of memory cells arranged in a row associated with the given word line.

In an embodiment, the word line power path WPP is arranged in common with respect to the write word line voltage Vol_W and the read word line voltage Vol_R, and the write word line voltage Vol_W or the read word line voltage Vol_R is selectively applied to the word line power path WPP based on a switching operation of the switch block 330. In addition, a ground voltage path GNDP for transferring a ground voltage VSS may be further arranged. Each of the driver circuits may be connected between a voltage WL_Power applied to the word line power path WPP and the ground voltage VSS. Although not shown in FIG. 4 for convenience, in an exemplary embodiment, one electrode of each of the driver circuits is electrically connected to the word line power path WPP, and another electrode of each of the driver circuits is electrically connected to the ground voltage path GNDP. In an exemplary embodiment, WL_POWER is either the write word line voltage Vol_W or the read word line voltage Vol_R. For example, the outer loop of FIG. 4 connected to output terminals of transistors 331 and 332 may be connected to the Left and Right Drivers to provide voltage WL_Power.

When the write enable signal CP_ON is activated, the write word line voltage generator 340 generates the write word line voltage Vol_W based on the charge pumping operation. During the activation period of the write enable signal CP_ON, the first switch 331 is turned on and provides the write word line voltage Vol_W to the word line power path WPP. In addition, during the deactivation period of the write enable signal CP_ON, the second switch 332 is turned on and provides the read word line voltage Vol_R to the word line power path WPP.

According to the embodiment shown in FIG. 4, word line power may be integrally managed through the word line power path WPP without the need for separation between paths for transferring the write word line voltage Vol_W and the read word line voltage Vol_R. In addition, the word line power may be integrally managed through a word line driver circuit without the need for separation between a write driver circuit and a read driver circuit. Further, in performing the write operation and the read operation, the word line power may be managed by controlling write power and read power through the switch block 330.

FIGS. 5 to 8 are flowcharts illustrating a method of operating a memory system, according to exemplary embodiments of the inventive concept.

Figure 5:
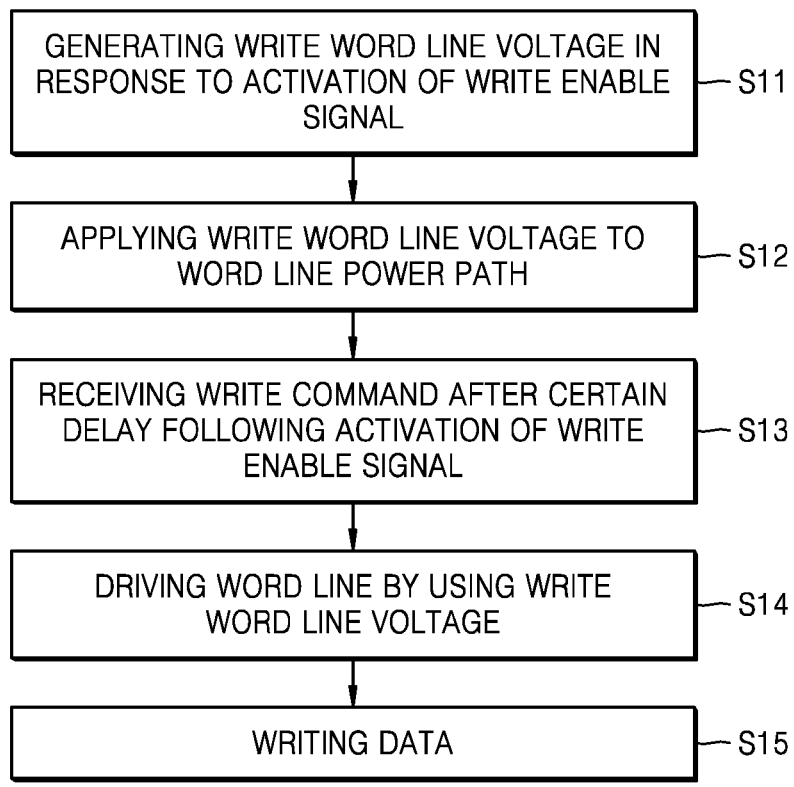
FIGS. 5 to 8 are flowcharts illustrating a method of operating a memory system, according to embodiments of the inventive concept.

FIG. 5 illustrates an example of an operation of the memory device. First, when the memory device receives the activated write enable signal from the memory controller, the memory device generates the write word line voltage (S11). In addition, the memory device may generate the read word line voltage, and the read word line voltage may be generated in association with the write enable signal or regardless of the write enable signal. As an example, in the memory device during a memory operation, the read word line voltage may be maintained in a generated state or be periodically or non-periodically generated. Alternatively, the read word line voltage may be generated in response to the reception of the read command. Alternatively, the read word line voltage may be generated in response to the deactivation of the write enable signal.

When the write enable signal is activated, the generated write word line voltage is applied to the word line power path (S12). As described above, the word line power path is configured to be arranged in common with respect to the write word line voltage and the read word line voltage, and in the write operation and the read operation, the word line driver may provide the voltage applied to the word line power path to the word line. The memory device receives the write command provided after a certain delay following the activation of the write enable signal (S13), and drives the word line by using the write word line voltage applied to the word line power path (S14). In addition, data is written according to the driving of the word line as described above (S15).

Figure 6:
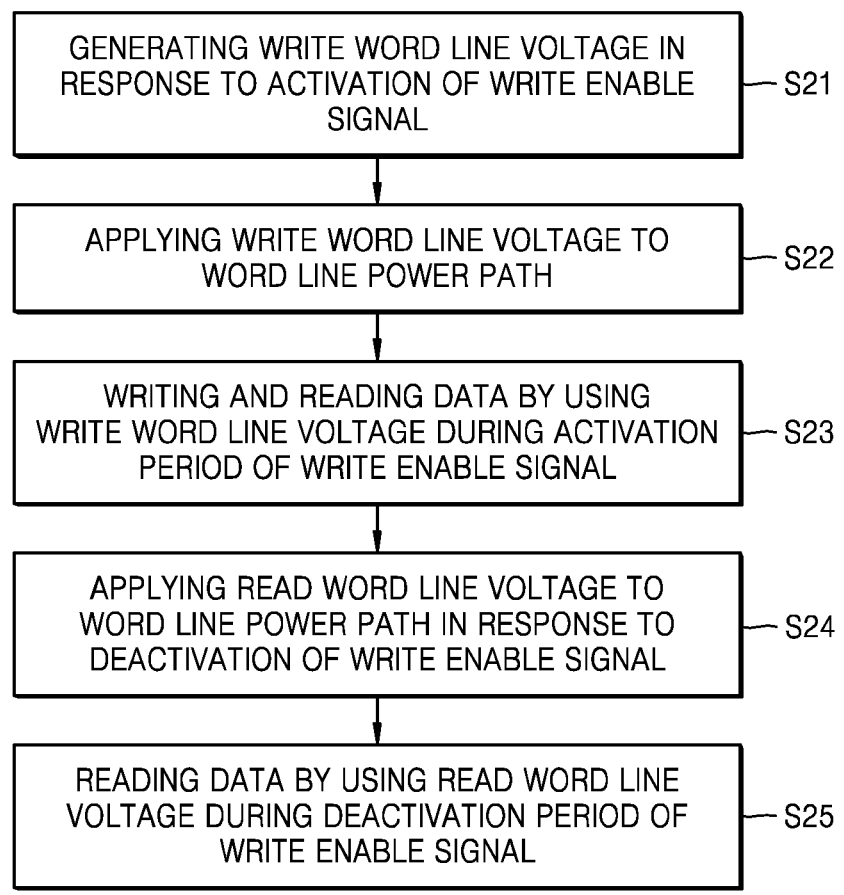

FIG. 6 illustrates another example of an operation of the memory device. The memory device receives the activated write enable signal from the memory controller and generates the write word line voltage in response thereto (S21). In addition, the generated write word line voltage is applied to the word line power path (S22). The memory device may receive the write command and the read command from the memory controller during the activation period of the write enable signal, and performs the data write and read operations corresponding to the received commands, by using the write word line voltage (S23).

Next, when the received write enable signal is deactivated, the read word line voltage is applied to the word line power path in response thereto (S24). The memory device may selectively receive only the read command from the memory controller during the deactivation period of the write enable signal. The memory device performs only the data read operation by using the read word line voltage during the deactivation period of the write enable signal (S25).

According to the embodiment set forth above, since the word line needs to be driven by using the write word line voltage at a relatively high level in the case of the write operation, the write operation is performed in the period in which the write enable signal is activated (or in a period in which the write word line voltage is applied to the word line power path). On the other hand, since the word line may be driven by using the read word line voltage at a relatively low level in the case of the read operation, the read operation may be performed regardless of the activation or deactivation of the write enable signal.

Figure 7:
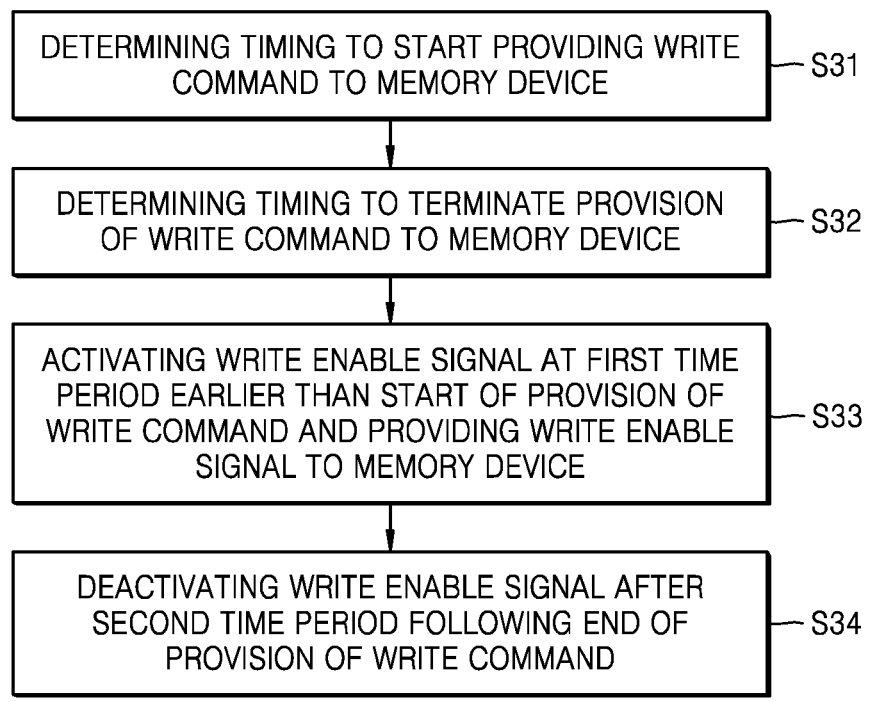

FIG. 7 illustrates an example of an operation of the memory controller. The memory controller may perform the data write and read operations by providing the write command and the read command to the memory device according to a request of the host. In an embodiment, the memory controller performs scheduling for writing and reading data. In this embodiment, the memory controller determines a timing to start to provide the write command to the memory device based on the scheduling (S31), and determines timing to terminate providing the write command to the memory device (S32).

As an example of an operation, upon initial driving of a system in which the memory system is employed, various information (for example, metadata) related to the operation of the system may be written (or stored) into the resistive memory device such as MRAM, and the number, provision timing, and the type of commands for writing the information may be determined based on the amount and/or type of the stored information. In an embodiment, after the information is written, the frequency of the read operation for the memory system is increased in a normal operation of the system. That is, the activation period of the write enable signal set forth above may be efficiently adjusted by taking into account usage characteristics of the memory system as described above.

The memory controller may activate the write enable signal and provide the write enable signal to the memory device, based on the timing determination as described above. In an exemplary embodiment, when one or more write commands are provided to the memory device, the memory controller activates the write enable signal at a first time period earlier than the start of the provision of the write commands and provides the write enable signal to the memory device (S33). The memory device may perform operations of generating and switching the write word line voltage by using the write enable signal activated at the first time period earlier than actual reception of the write commands. In an embodiment, the memory controller deactivates the write enable signal after a second time period following the end of the provision of the write commands (S34). As an example, the memory controller may deactivate the write enable signal directly after the end of the provision of the write commands. Alternatively, the write enable signal may be deactivated after a certain delay following the end of the provision of the write commands, and one or more read commands may be further provided to the memory device during the certain delay.

Figure 8:
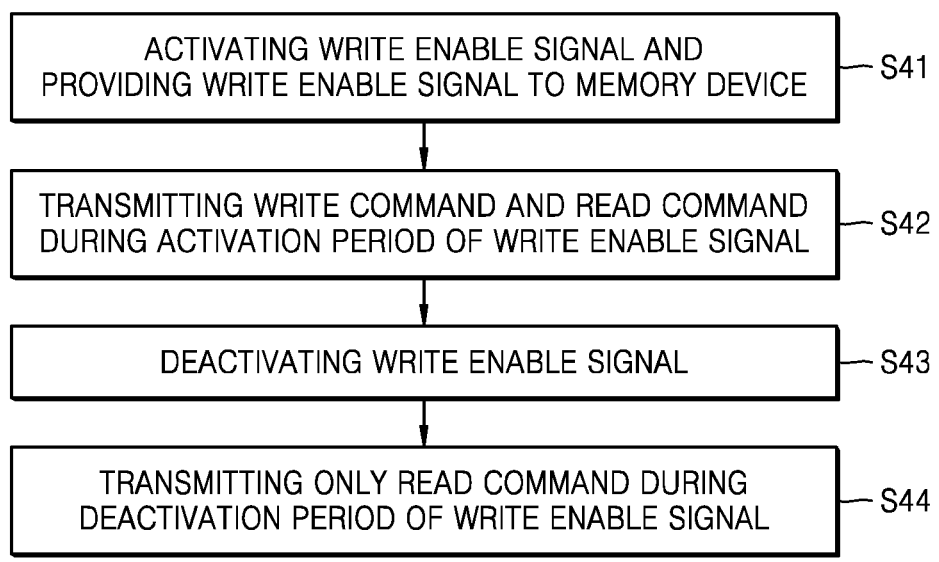

FIG. 8 illustrates another example of an operation of the memory controller. In an embodiment, the memory controller activates the write enable signal and provides the write enable signal to the memory device (S41). The memory controller transmits the write command and the read command to the memory device during the activation period of the write enable signal (S42). The memory device may perform the write operation and the read operation by using the write word line voltage during the activation period of the write enable signal.

In addition, the memory controller deactivates the write enable signal provided to the memory device according to the end of the write operation (S43). The memory controller transmits only the read command to the memory device during the deactivation period of the write enable signal (S44). The memory device may perform only the read operation by using the read word line voltage during the deactivation period of the write enable signal.

Figure 9:
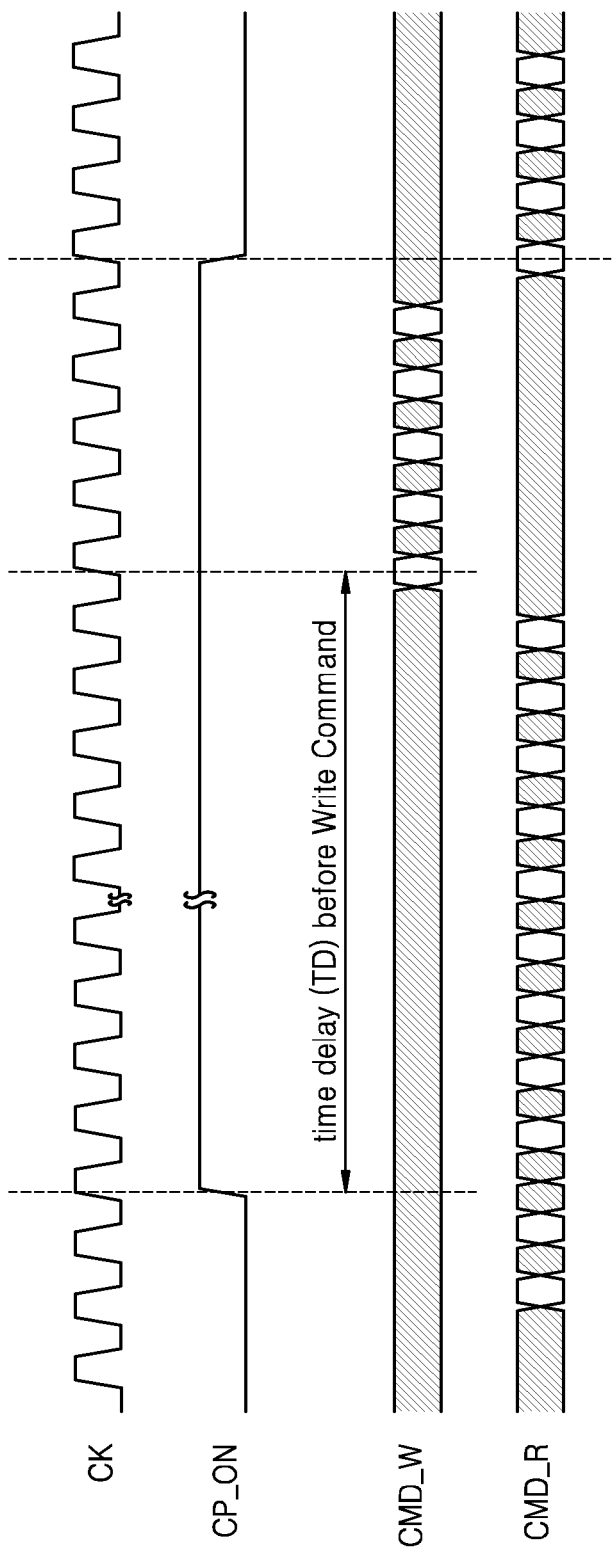
FIGS. 9 to 11 are waveform diagrams illustrating memory operations, according to exemplary embodiments of the inventive concept.
Figure 10:
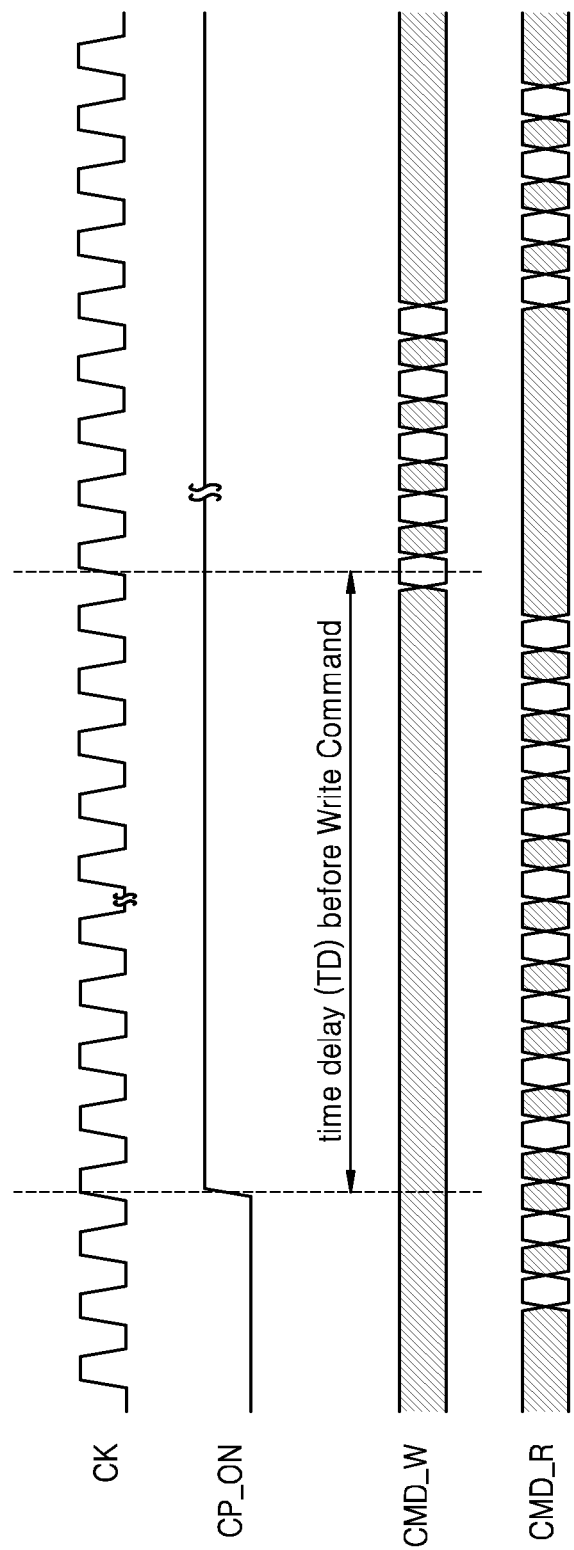
Figure 11:
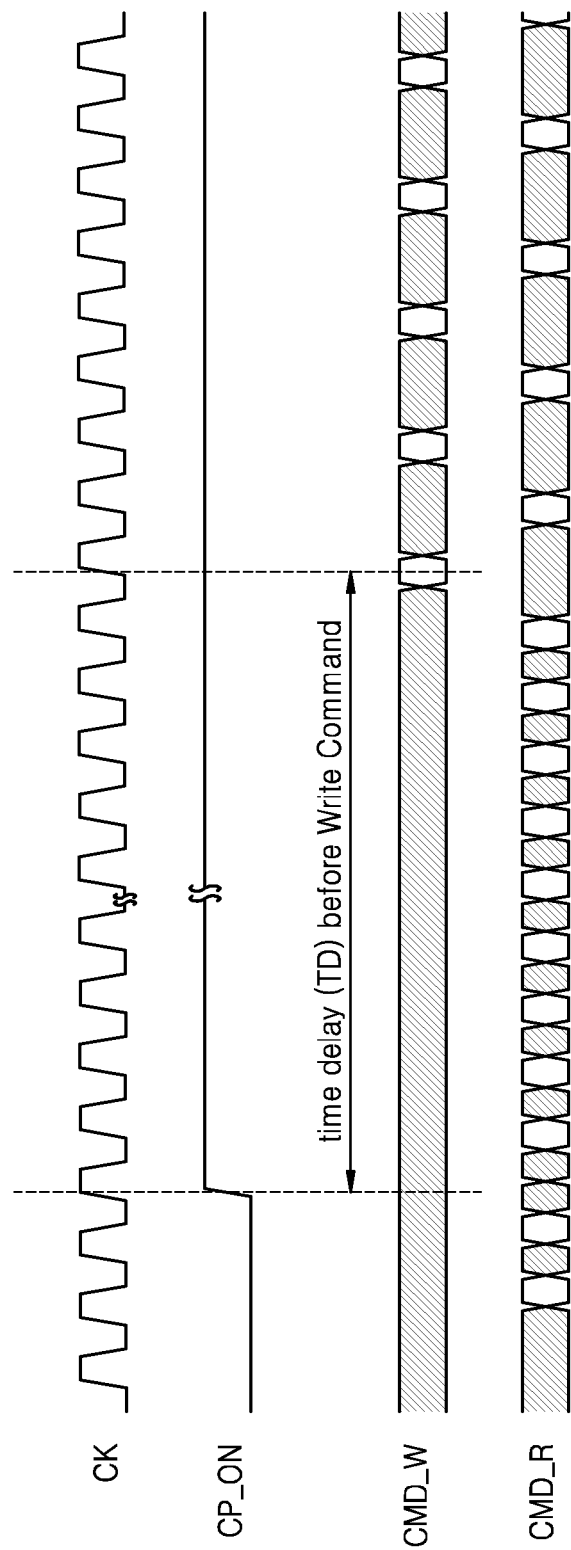

FIGS. 9 to 11 are waveform diagrams illustrating memory operations according to exemplary embodiments of the inventive concept.

Referring to FIG. 9, the memory controller may provide various signals, for example, a clock signal CK, the write enable signal CP_ON, the write command CMD_W, and the read command CMD_R, to the memory device. The memory device may perform various operations synchronously with the clock signal CK, and may perform operations of managing the word line power according to the embodiments set forth above in response to the write enable signal CP_ON.

In FIG. 9, the memory device receives the write command CMD_W after a certain time delay TD following the activation of the write enable signal CP_ON. That is, since the write command CMD_W is received after the time delay TD, a time period for which the word line power for the write operation is set may be secured. That is, the word line power may have a sufficient level to write data due to the time delay TD. In addition, one or more write commands CMD_W may be provided to the memory device during the activation period of the write enable signal CP_ON, and FIG. 9 illustrates an example in which a plurality of write commands CMD_W are consecutively provided to the memory device. Further, FIG. 9 illustrates an example in which the write enable signal CP_ON is deactivated after the plurality of write commands CMD_W are consecutively provided to the memory device.

One or more read commands CMD_R may further provided to the memory device during the activation period of the write enable signal CP_ON, and FIG. 9 illustrates an example in which the read command CMD_R is provided to the memory device within a period of the time delay TD. The memory device performs the read operation within the period of the time delay TD, by using the write word line voltage set forth above, and performs the read operation after the deactivation of the write enable signal CP_ON, by using the read word line voltage.

FIG. 10 illustrates a modified example of the memory operation of FIG. 9. In FIG. 10, the memory device receives the write command CMD_W after the certain time delay TD following the activation of the write enable signal CP_ON. In addition, FIG. 10 illustrates an example in which the write enable signal CP_ON is maintained in an activation state even after the plurality of write commands CMD_W are consecutively provided to the memory device.

As shown in FIG. 10, the read command CMD_R may be received by the memory device regardless of the activation or deactivation of the write enable signal CP_ON, whereby the read operation may be performed. That is, the read operation may be performed without limitation caused by the write enable signal CP_ON, and FIG. 10 illustrates an example, in which the read command CMD_R is received prior to the write commands CMD_W in the activation period of the write enable signal CP_ON, and in which the read command CMD_R is further received even after all of the write commands CMD_W are received.

FIG. 11 illustrates an example, in which only the read command CMD_R is received within the certain time delay TD after the activation of the write enable signal CP_ON, and in which the read command CMD_R and the write command CMD_W are alternately received after the elapse of the time delay TD. That is, in the activation period of the write enable signal CP_ON after the elapse of the time delay TD, the read command CMD_R and the write command CMD_W are both received.

Although the write enable signal CP_ON is shown as being activated when having a logic high in the embodiments of FIGS. 9 to 11 set forth above, the inventive concept is not limited thereto. As an example, depending upon circuits implemented in the memory device, the write enable signal CP_ON may be defined as being activated when having a logic low.

In addition, according to the embodiments of FIGS. 9 to 11 set forth above, although the certain time delay is needed until an initial write operation after the activation of the write enable signal CP_ON, consecutive write operations, consecutive read operations, or alternating write/read operations may be performed thereafter without limitation. In addition, since the reliability of a semiconductor chip may be affected when the write word line voltage having a relatively high level continues to be used for a long period of time, considering this, the total activation period of the write enable signal CP_ON may be adjusted.

Figure 12:
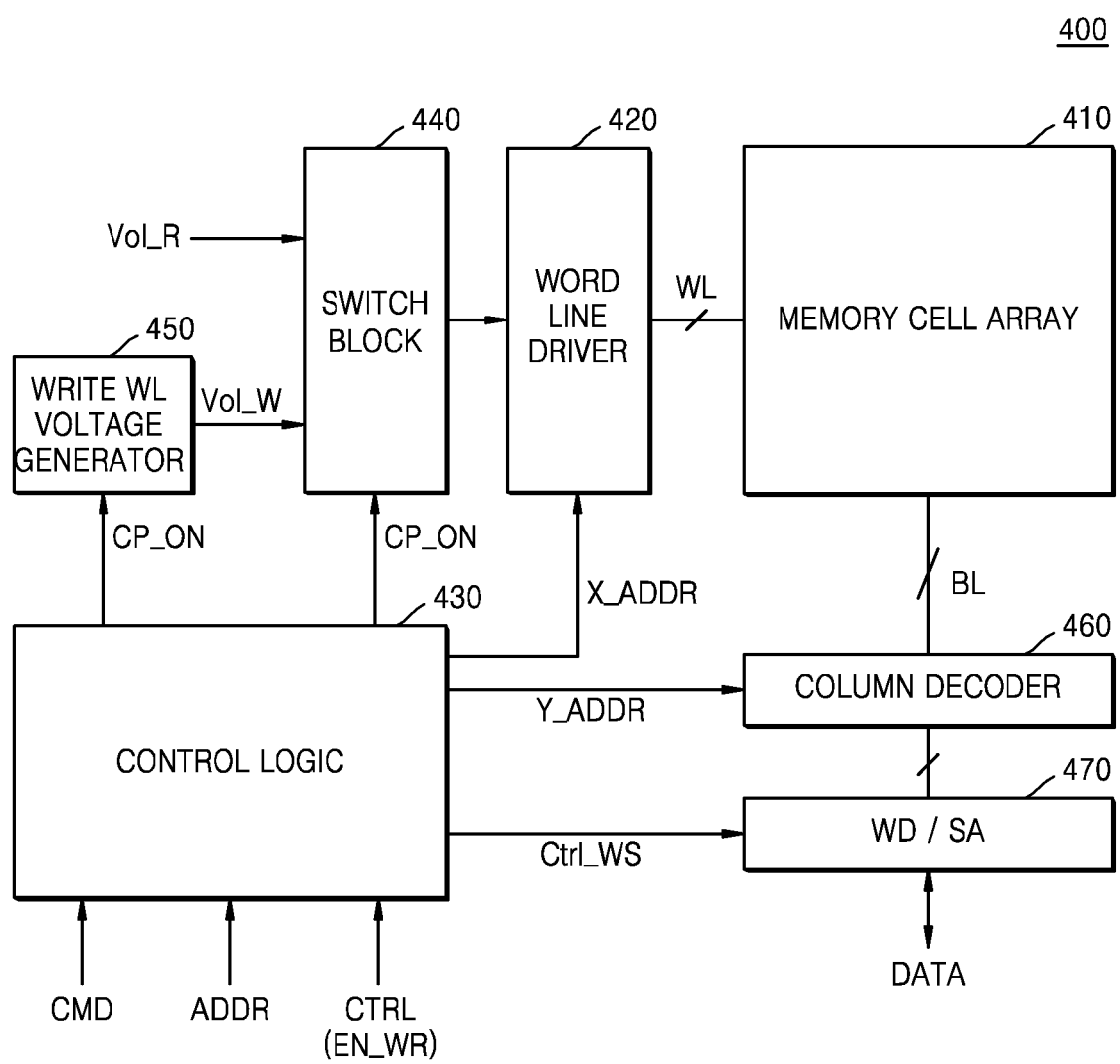
FIG. 12 is a block diagram illustrating a memory device according to an exemplary embodiment of the inventive concept.

FIG. 12 is a block diagram illustrating a memory device according to an exemplary embodiment of the inventive concept.

Referring to FIG. 12, a memory device 400 includes a memory cell array 410, a word line driver 420, control logic 430, a switch block 440, and a write word line voltage generator 450. In addition, the memory device 400 may further include a column decoder 460 and a write driver/sense amplifier block 470 (e.g., one or more sense amplifiers). In addition to these components, the memory device 400 may further include various components related to the memory operation, such as the read word line voltage generator (not shown).

The control logic 430 controls the memory operation according to various signals from the memory controller. In an embodiment, the control logic 430 receives an address ADDR from the memory controller, provides a row address X_ADDR for selecting word lines WL of the memory cell array 410 to the word line driver 420, and provides a column address Y_ADDR for selecting bit lines BL of the memory cell array 410 to the column decoder 460. The row address X_ADDR and the column address Y_ADDR may be generated from the address ADDR. A word line address may be determined from the row address X_ADDR and a bit line address may be determined from the column address Y_ADDR. In an embodiment, the write driver/sense amplifier block 470 is connected to the bit lines BL via the column decoder 460, and writes data DATA to a memory cell or reads the data DATA from the memory cell based on an internal control signal Ctrl_WS from the control logic 430.

According to an embodiment of the inventive concept, the write enable signal CP_ON is generated by the control logic 430 by using the control signal CTRL from the memory controller. As an example, the control signal CTRL may include activation information EN_WR related to the activation timing and activation period of the write enable signal CP_ON, and the control logic 430 may generate the write enable signal CP_ON according to the embodiments set forth above by using the activation information EN_WR from the memory controller. In addition, the write enable signal CP_ON is provided to the write word line voltage generator 450, and the write word line voltage generator 450 generates the write word line voltage Vol_W in response to the activation of the write enable signal CP_ON. According to an embodiment, the write word line voltage Vol_W is generated based on a charge pumping operation, and has a higher level than the read word line voltage Vol_R.

In an embodiment, the switch block 440 includes a first switch (not shown) for switching the write word line voltage Vol_W and a second switch (not shown) for switching the read word line voltage Vol_R, and performs a switching operation in response to the write enable signal CP_ON. As an example, the switch block 440 may provide the write word line voltage Vol_W to the word line driver 420 when the write word line voltage Vol_W is activated, and may provide the read word line voltage Vol_R to the word line driver 420 when the write word line voltage Vol_W is deactivated.

The configuration and operation of the memory device 400 in the embodiment set forth above may be variously modified. As an example, the operations according to the embodiment of the inventive concept, such as generation of the write word line voltage Vol_W, and the switching operation of the switch block 440, may be performed in other various manners. For example, the memory device 400 may be implemented such that, while some operations are directly controlled by the activation information EN_WR from the memory controller, some other operations are controlled by the write enable signal CP_ON from the control logic 430.

Figure 13:
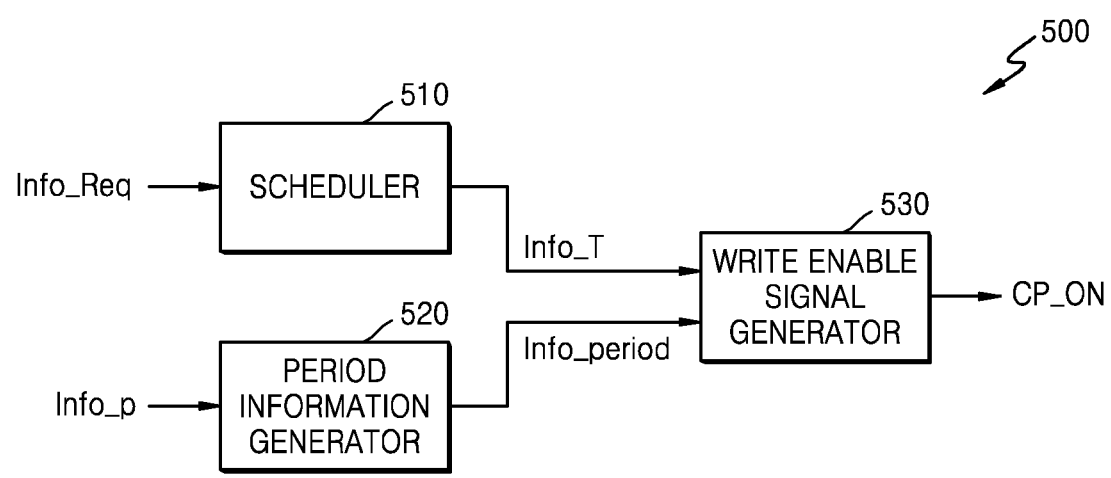
FIG. 13 is a block diagram illustrating a memory controller according to an exemplary embodiment of the inventive concept.

FIG. 13 is a block diagram illustrating a memory controller according to an exemplary embodiment of the inventive concept.

Referring to FIG. 13, a memory controller 500 includes a scheduler 510, a period information generator 520, and a write enable signal generator 530. In addition to these components, the memory controller 500 may further include other various components such as a processor for controlling overall operations of the memory system.

The scheduler 510 may perform scheduling for the write command and the read command that are to be provided to the memory device, according to information Info_Req related to data write and read requests from the host. As an example, the scheduler 510 may provide first information Info_T related to timing, at which the write command starts to be provided to the memory device, to the write enable signal generator 530. In addition, the first information Info_T may include other additional information such as information related to timing at which the provision of the write command is terminated. Further, when the write enable signal CP_ON is activated before the write command is provided according to the embodiment set forth above, the first information Info_T may include information on timing earlier as much as a certain time period than a time point of initial transmission of the write command.

The period information generator 520 generates second information Info_period for adjusting the activation period of the write enable signal CP_ON, and provides the second information Info_period to the write enable signal generator 530. As an example, the period information generator 520 may receive information Info_p related to power of the memory device and may generate the second information Info_period based on the information Info_p. For example, the activation period of the write enable signal CP_ON may be changed based on power consumption allowed by the memory device or to adjust an operation performance of the memory device, and the second information Info_period for adjusting the activation period may be provided to the write enable signal generator 530.

In an embodiment, the write enable signal generator 530 generates the write enable signal CP_ON based on the first information Info_T and the second information Info_period.

As an example, the activation timing of the write enable signal CP_ON may be determined by the first information Info_T, and the activation period of the write enable signal CP_ON may be determined by the second information Info_period.

Figure 14:
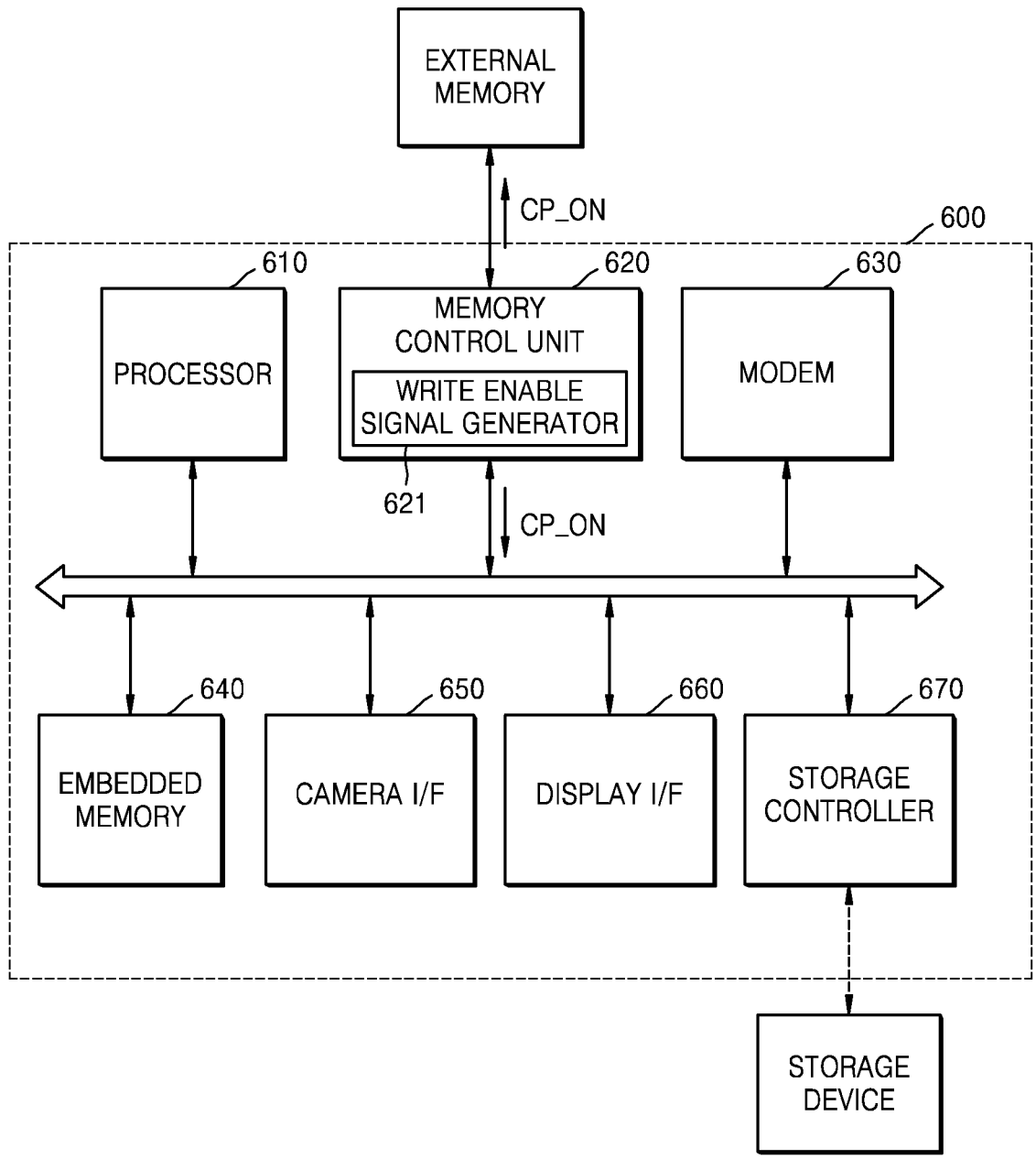
FIG. 14 is a block diagram illustrating an example in which a memory device according to embodiments of the inventive concept is applied to memory internal to an application processor and memory external thereto.

FIG. 14 is a block diagram illustrating an example in which the memory device according to embodiments of the inventive concept is applied to memory internal to an application processor and memory external thereto.

Referring to FIG. 14, an application processor 600 may include one or more intellectual property (IP) blocks. As an example, the application processor 600 may include a processor 610, a memory control unit 620, a modem 630, embedded memory 640, a camera interface 650, a display interface 660, and a storage controller 670, which are connected to each other via a system bus. In addition, the memory control unit 620 may control the memory operation for the embedded memory 640 or memory external to the application processor 600. Further, the storage controller 670 may control a storage device external to the application processor 600. Since the modem 630 is included in the application processor 600, the application processor 600 may be referred to as ModAP.

The processor 610 may control overall operations of the application processor 600. As an example, software for managing operations of various IP blocks in the application processor 600 may be loaded into the external memory and/or the embedded memory 640, and the processor 610 may perform various management operations by executing the loaded software.

The various memory or storage shown in FIG. 14 may include the memory device according to the embodiments set forth above. As an example, the external memory or the embedded memory 640 may correspond to the resistive memory device according to the embodiments set forth above, and the memory control unit 620 may correspond to the memory controller 100 according to the embodiments set forth above. Thus, the memory control unit 620 may generate the write enable signal CP_ON and provide the write enable signal CP_ON to the external memory or the embedded memory 640, and each of the external memory and the embedded memory 640 may generate the write word line voltage in response to the write enable signal CP_ON or may provide the write word line voltage to the word line power path.

The storage device may include non-volatile memory, and the resistive memory device according to the embodiments set forth above may be included as the non-volatile memory in the storage device. Here, although not shown in FIG. 14, the storage controller 670 may generate the write enable signal CP_ON according to the embodiments set forth above and provide the write enable signal CP_ON to the external storage device.

Figure 15:
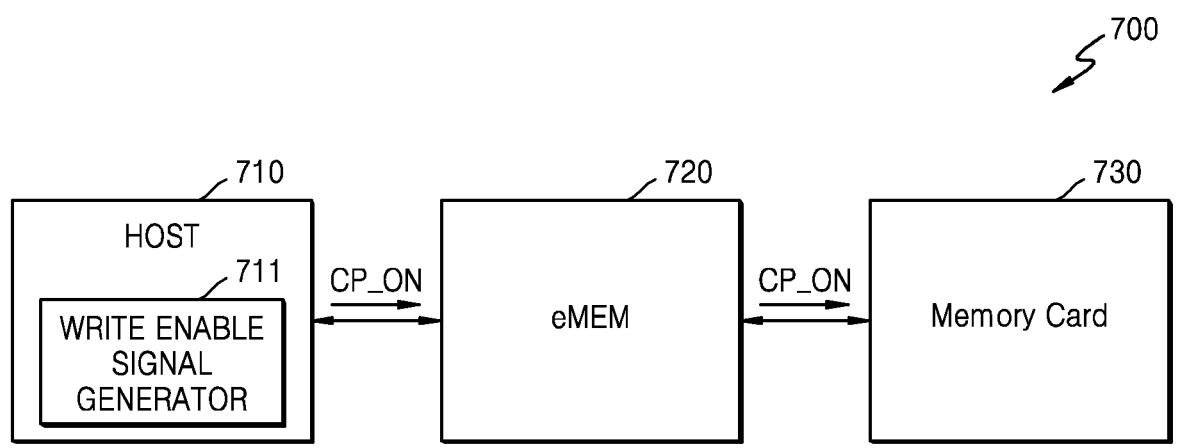
FIG. 15 is a block diagram illustrating an example in which a memory device according to embodiments of the inventive concept is applied to embedded memory or a memory card of a data processing system.

FIG. 15 is a block diagram illustrating an example in which the memory device according to embodiments of the inventive concept is applied to embedded memory or a memory card of a data processing system.

A data processing system 700 includes a host 710 and one or more memory devices, and FIG. 15 illustrates embedded memory 720 and a memory card 730 as the one or more memory devices. The embedded memory 720 may be memory embedded in the data processing system 700, and the memory card 730 may be a device capable of being removably connected to the data processing system 700. The host 710 may provide various request signals related to data access to the embedded memory 720 and the memory card 730, and accessed data may be transmitted and received between the host 710, the embedded memory 720, and the memory card 730.

FIG. 15 illustrates an example in which the host 710, the embedded memory 720, and the memory card 730 are connected in a topological shape of a chain (or daisy chain). Thus, the host 710 may be physically indirectly connected to the memory card 730, and the requests and accessed data from the host 710 may be transmitted to the memory card 730 via the embedded memory 720. However, this is merely an example as the host 710 may be physically connected to the memory card 730 and directly communicate the requests and accessed data thereto.

The host 710 may include various circuits for transmitting data requests, for example, a central processing unit (CPU), a processor, and a microprocessor. In addition, the host 710 may include a memory control unit (not shown) for controlling the memory operation for the embedded memory 720 and the memory card 730.

At least one of the embedded memory 720 and the memory card 730 may include the memory device according to the embodiments set forth above. Here, the host 710 may provide the write enable signal CP_ON in the embodiments set forth above to the embedded memory 720 and/or the memory card 730. Alternatively, at least one of the embedded memory 720 and the memory card 730 may correspond to the memory system 10 according to the embodiments set forth above. When the embedded memory 720 corresponds to the memory system 10 set forth above, the embedded memory 720 may include the memory controller (not shown) and the memory device (not shown), and here, the write enable signal CP_ON in the embodiments set forth above may be generated in the memory controller 100 in the embedded memory 720.

While the inventive concept has been particularly shown and described with reference to embodiments thereof, it will be understood that various changes in form and details may be made therein without departing from the spirit and scope of the inventive concept.

What is claimed is:
1. A memory device comprising:
a voltage generator generating a write word line voltage according to activation of a write enable signal;
a switch circuit outputting one of the write word line voltage and a read word line voltage in response to the write enable signal as an output word line voltage;
a word line power path connected to the switch circuit to receive the output word line voltage; and
a word line driver driving a word line of the memory device according to a voltage applied to the word line power path, wherein the memory device starts to receive a write command after a certain delay following the activation of the write enable signal, and a write operation is performed on the memory device within an activation period of the write enable signal in response to the received write command,
wherein at least one read command is further received during the activation period of the write enable signal, and
wherein only a read command is received during a deactivation period of the write enable signal.
2. The memory device according to claim 1, wherein the write enable signal is provided by a memory controller external to the memory device.
3. The memory device according to claim 1, wherein the switch circuit comprises:

a first switch configured to output the write word line voltage to the word line power path based on a state of the write enable signal; and a second switch configured to output the read word line voltage to the word line power path based on a state of the write enable signal.

4. The memory device according to claim 3, wherein the first switch is turned on to output the write line voltage while the write enable signal is activated, and the second switch is turned on to output the read line voltage while the write enable signal is deactivated.

5. The memory device according to claim 1, wherein, in response to at least one read command further received during the activation period of the write enable signal, a read operation is further performed within the activation period.

6. The memory device according to claim 5, wherein the at least one read command is received before the certain delay has elapsed and after the activation of the write enable signal.

7. The memory device according to claim 1, wherein only a read operation corresponding to the read command is performed on the memory device within the deactivation period.

8. A method of operating a resistive memory device, the method comprising:

generating, by a word line driver, a first word line voltage in response to activation of a write enable signal;

generating, by the word line driver, a second word line voltage related to a read operation;

transferring, by the word line driver, the first word line voltage to a word line power path in response to the activation of the write enable signal;

performing a write operation by driving a word line of the resistive memory device by using the first word line voltage, in correspondence with a write command received after a certain delay following the activation of the write enable signal; and performing the read operation by driving the word line by using the first word line voltage, in correspondence with at least one read command received during an activation period of the write enable signal, wherein the word line power path is arranged in common with respect to the first word line voltage and the second word line voltage, and wherein the word line is driven by activating the word line by using the first word line voltage or the second word line voltage.

9. The method according to claim 8, further comprising:

transferring, by the word line driver, the second word line voltage to the word line power path in response to deactivation of the write enable signal, wherein the first word line voltage and the second word line voltage have different levels from each other.

10. The method according to claim 9, further comprising:

during a deactivation period of the write enable signal, receiving, by the resistive memory device, only a read command from a memory controller external to the resistive memory device; and performing the read operation by driving the word line using the second word line voltage.

11. A method of operating a memory controller controlling a memory device, the method comprising:

activating, by the memory controller, a write enable signal and providing the write enable signal to the memory device;

starting, by the memory controller, transmission of one or more write commands to the memory device, after a certain delay following the activation of the write enable signal;

transmitting, by the memory controller, at least one read command during an activation period of the write enable signal; and deactivating, by the memory controller, the write enable signal after completion of the transmission of the one or more write commands and the at least one read command, wherein the one or more write commands and the at least one read command are together transmitted during the same activation period of the write enable signal.

12. The method according to claim 11, further comprising:

transmitting, by the memory controller, only a read command during a deactivation period of the write enable signal.

* * * * *